US009028736B2

(12) United States Patent
Choi et al.

(10) Patent No.: US 9,028,736 B2
(45) Date of Patent: May 12, 2015

(54) APPARATUSES AND METHODS FOR FABRICATING SEMICONDUCTOR PACKAGES

(71) Applicant: Samsung Electronics Co., Ltd., Suwon-si (KR)

(72) Inventors: Youngshin Choi, Cheonan-si (KR); Kikwon Jeong, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/169,258

(22) Filed: Jan. 31, 2014

(65) Prior Publication Data

US 2014/0145369 A1 May 29, 2014

Related U.S. Application Data

(63) Continuation of application No. 12/853,545, filed on Aug. 10, 2010, now Pat. No. 8,647,110.

(30) Foreign Application Priority Data

Oct. 28, 2009 (KR) ........................ 10-2009-0102998

(51) Int. Cl.
*B29C 45/14* (2006.01)
*H01L 21/02* (2006.01)
*B29C 45/56* (2006.01)

(52) U.S. Cl.
CPC .......... *H01L 21/02* (2013.01); *B29C 45/14655* (2013.01); *B29C 45/56* (2013.01); *H01L 2224/16* (2013.01); *H01L 2224/32145* (2013.01); *H01L 2224/48091* (2013.01); *H01L 2224/73265* (2013.01)

(58) Field of Classification Search
CPC ................... B29C 45/14639; B29C 45/14819; B29C 45/14647; B29C 45/14655; B29C 45/1468; B29C 45/56; B29C 45/561; B29C 70/70; B29C 70/72
USPC ............. 264/272.11, 272.12, 272.13, 272.14, 264/272.15, 272.16, 272.17, 272.18, 264/272.19, 272.2, 272.21; 425/110, 453, 425/467, 577, 121, 123, 171, 466
See application file for complete search history.

(56) References Cited

U.S. PATENT DOCUMENTS

| 4,769,344 | A | * | 9/1988 | Sakai et al. ............... 264/272.17 |
| 6,000,924 | A | | 12/1999 | Wang et al. |
| 6,081,978 | A | | 7/2000 | Utsumi et al. |
| 6,641,382 | B2 | | 11/2003 | Mine |
| 6,929,977 | B2 | * | 8/2005 | Takase et al. ................. 425/125 |

(Continued)

FOREIGN PATENT DOCUMENTS

| JP | 61-193814 | 8/1986 |
| JP | 2001-308117 | 11/2001 |

(Continued)

*Primary Examiner* — Timothy Kennedy
(74) *Attorney, Agent, or Firm* — Myers Bigel Sibley & Sajovec, P.A.

(57) ABSTRACT

An apparatus for fabricating a semiconductor package may include a mold and a molding plate. The mold may define a mold cavity with the mold being configured to receive a circuit board in the mold cavity, and the circuit board may include a semiconductor chip mounted thereon. A molding plate may be moveable in the mold cavity with the molding plate being configured to adjust a volume of the mold cavity. Related methods are also discussed.

19 Claims, 15 Drawing Sheets

(56) References Cited

U.S. PATENT DOCUMENTS

| | | | |
|---|---|---|---|
| 7,147,447 B1 * | 12/2006 | Takahashi | 425/89 |
| 7,371,606 B2 | 5/2008 | Ujie et al. | |
| 7,520,052 B2 | 4/2009 | Takahashi et al. | |
| 2002/0017738 A1 | 2/2002 | Miyajima | |
| 2002/0025352 A1 | 2/2002 | Miyajima | |
| 2002/0041911 A1 | 4/2002 | Mine | |
| 2002/0151103 A1 | 10/2002 | Nakamura et al. | |
| 2005/0106786 A1 | 5/2005 | Kuratomi et al. | |
| 2010/0015759 A1 | 1/2010 | Takano et al. | |

FOREIGN PATENT DOCUMENTS

| | | |
|---|---|---|
| JP | 2002-113752 | 4/2002 |
| JP | 2002-176067 | 6/2002 |
| JP | 2002-368190 | 12/2002 |
| JP | 2004-006482 | 1/2004 |
| JP | 2005-150350 | 6/2005 |
| JP | 2005-183794 | 7/2005 |
| KR | 1020050063700 A | 6/2005 |
| KR | 1020070010312 A | 1/2007 |

* cited by examiner

APPARATUSES AND METHODS FOR FABRICATING SEMICONDUCTOR PACKAGES

RELATED APPLICATIONS

This U.S. non-provisional patent application claims the benefit of priority as a continuation of U.S. application Ser. No. 12/853,545 filed Aug. 10, 2010, which claims the benefit of priority under 35 U.S.C. §119 of Korean Patent Application 10-2009-0102998, filed on Oct. 28, 2009. The disclosures of both of the above referenced applications are hereby incorporated herein in their entireties by reference.

BACKGROUND

The present disclosure relates to electronics, and more particularly to packaging for semiconductor devices.

A semiconductor package protects a semiconductor chip against an outside environment and provides physical and electrical connection with an electronic system. Packaging technology may affect performance of semiconductor devices, and performance, price and reliability of products. Generally, a semiconductor package is fabricated by providing a semiconductor chip on a printed circuit board, electrically connecting the printed circuit board and the semiconductor chip, and then encapsulating electrical junctions with mold material. Demand for thinner semiconductor packages is increasing due to the trend toward lighter and thinner devices.

SUMMARY

According to some embodiments of the present invention, an apparatus for fabricating a semiconductor package may include a mold and a molding plate. The mold may define a mold cavity with the mold being configured to receive a circuit board in the mold cavity. More particularly, the circuit board may include a semiconductor chip mounted thereon. The molding plate may be moveable in the mold cavity with the molding plate being configured to adjust a volume of the mold cavity.

According to some other embodiments of the present invention, a method for fabricating a semiconductor device may include providing a molding plate and a circuit board with a semiconductor chip mounted thereon in a mold cavity of a mold. A molding material may be provided into the mold cavity with the circuit board therein. Moreover, the molding plate may be configured to move in the mold cavity relative to the circuit board to adjust a volume of the mold cavity.

Embodiments of the present invention may provide an apparatus and a method for fabricating semiconductor packages with enhanced reliability.

Embodiments of the present invention may provide an apparatus used to fabricate semiconductor packages including a mold having a mold cavity configured to receive a circuit board on which a semiconductor chip is mounted. In addition, a molding plate may be movable in the mold cavity to change the mold cavity.

In some embodiments, the apparatus may include a moving unit moving the molding plate to change a distance between the circuit board and the molding plate.

In other embodiments, the apparatus may include an elastic member providing elastic force to the molding plate in a direction toward the circuit board.

In still other embodiments, the mold may include a lower mold and an upper mold disposed on the lower mold and having the mold cavity, wherein the molding plate is provided to move up and down in the mold cavity.

In even other embodiments, the molding plate may be disposed in parallel with the upper surface of the lower mold.

In yet other embodiments, the semiconductor chip may include a flip chip and the circuit board may be provided on the lower mold such that the mounted surface of the semiconductor chip faces upward.

In further embodiments, the sidewall of the molding plate and the inner wall of the upper mold contacting each other may be coated with ceramics.

In still further embodiments, a sealing film may be provided on the upper and side parts of the mold cavity that is defined by the molding plate and the upper mold.

In even further embodiments, the apparatus may include a press member providing melted molding material into the mold cavity by pressurizing the molding material, wherein the molding plate moves up and down by pressure of the press member.

In yet further embodiments, the apparatus may include a press member providing melted molding material into the mold cavity by pressurizing the molding material, wherein the molding plate moves up and down by an amount of the molding material that the press member provides.

In yet further embodiments, the moving unit may include a support plate disposed horizontally above the upper mold, a plurality of moving rods provided through the upper mold such that one end of the rod is coupled with the molding plate and another end of the rod is coupled with the support plate. An elastic member may be disposed between the support plate and the upper mold and a driving member may push the support plate downward.

In other embodiments of the present invention, methods for fabricating a semiconductor package may include providing a circuit board mounted with semiconductor chips in a mold cavity of a mold. The semiconductor chips may be molded by providing molding material into the mold cavity, wherein a molding plate is provided to be movable in the mold cavity to change space of the mold cavity.

In some embodiments, the mold may include a lower mold and an upper mold to be coupled or separated from the lower mold in a vertical direction. The circuit board may be provided between the lower mold and the upper mold, and the molding material may be provided into the mold cavity between the circuit board and the molding plate.

In other embodiments, the semiconductor chip may include contact terminals that contact with the circuit board to be disposed between the circuit board and the semiconductor chip. The molding of the semiconductor chips may include moving the molding plate down to provide molding material between the semiconductor chips and the circuit board. The molding plate may be moved up to provide additional molding material.

In still other embodiments, the molding material may be provided between the semiconductor chips and the circuit board while the molding plate contacts with the semiconductor chips.

In even other embodiments, the molding material may be provided between the semiconductor chips and the circuit board while the molding plate is separated from the semiconductor chips.

In yet other embodiments, a first pressure of the molding material flowing between the molding plate and the semiconductor chips may be equivalent to a second pressure of the molding material flowing between the semiconductor chips and the circuit board.

In further embodiments, the semiconductor chips may include flip chips, and the molding material provided between the flip chips and the circuit board may be identical to molding material that is provided between the flip chips and the molding plate.

In still further embodiments, the molding of the semiconductor chips may include moving the molding plate up to provide the molding material on the semiconductor chips. The molding plate may be moved down to draw back a portion of the molding material on the semiconductor chips.

In even further embodiments, the semiconductor chip may be formed of a plurality of stacked semiconductor chips.

BRIEF DESCRIPTION OF THE DRAWINGS

The accompanying drawings are included to provide a further understanding of embodiments of the present invention, and are incorporated in and constitute a part of this specification. The drawings illustrate embodiments of the present invention and, together with the description, serve to explain principles of the present invention. In the figures.

DETAILED DESCRIPTION

Figure 1:
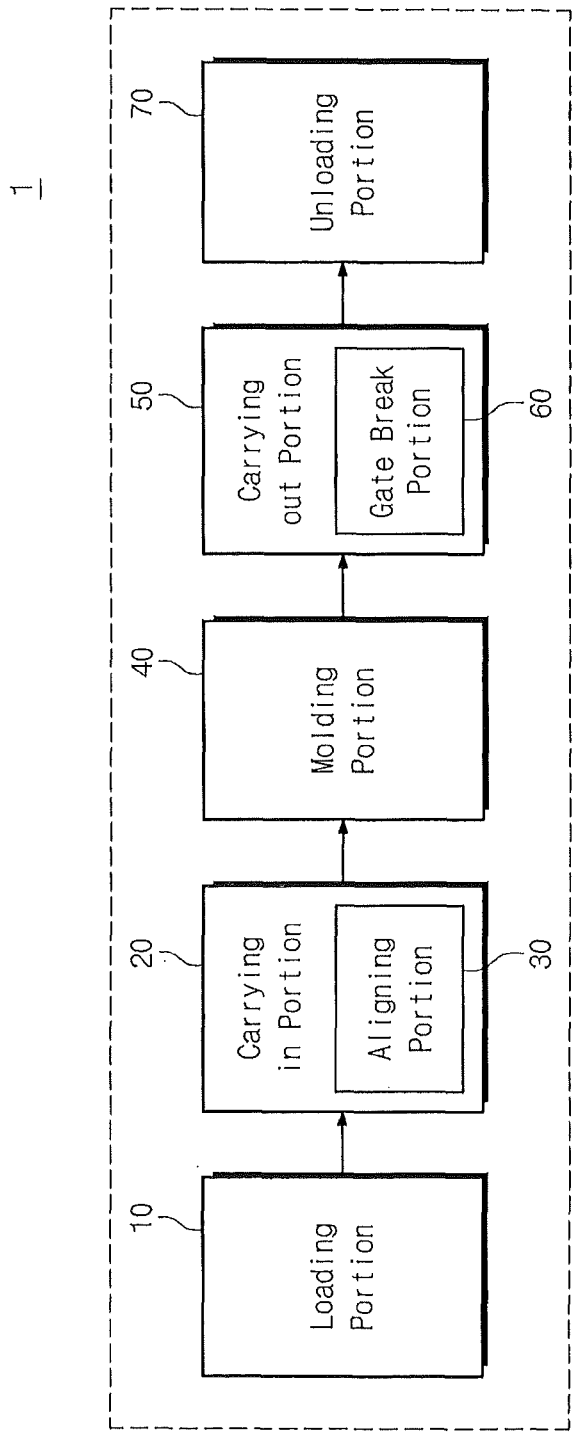
FIG. 1 is a block diagram illustrating an apparatus for fabricating semiconductor packages according to some embodiments of the present invention.

Advantages and features of the present invention and methods of accomplishing the same may be understood more readily by reference to the following detailed description of embodiments and the accompanying drawings. The present invention may, however, be embodied in many different forms and should not be construed as being limited to embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc, may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the illustrated features may be changed due to, for example, the manufacturing technology and/or tolerance. Accordingly, it should be understood that the example embodiments of the inventive concept are not limited to the drawings but include modifications of the features of elements caused due to, for example, the manufacture.

FIG. 1 is a block diagram illustrating an apparatus used to fabricate semiconductor packages according to embodiments of the present invention.

Referring to FIG. 1, an apparatus 1 used to fabricate semiconductor packages may include a loading portion 10, a carrying in portion 20, a molding portion 40, a carrying out portion 50 and an unloading portion 70.

A circuit board with a semiconductor chip thereon may be transferred to the apparatus 1 to fabricate semiconductor packages through the loading portion 10. The circuit board may be aligned at an aligning portion 30 that is provided to the carrying in portion 20, and transferred to the molding portion 40 by the carrying in portion 20. The molding process may be performed at the molding portion 40 so that the circuit board with the semiconductor chip is encapsulated with plastic resin. However, residual resin may remain on the encapsulated semiconductor package near a gate. The residual resin is removed at a gate break portion 60 and the semiconductor package is transferred to the unloading portion 70 by the carrying out portion 50. The unloading portion 70 unloads the semiconductor package out of the apparatus used to fabricate semiconductor packages. The aligning portion 30 may be separated from the carrying in portion 20, and the gate break portion 60 may be separated from the carrying out portion 50.

Figure 2:
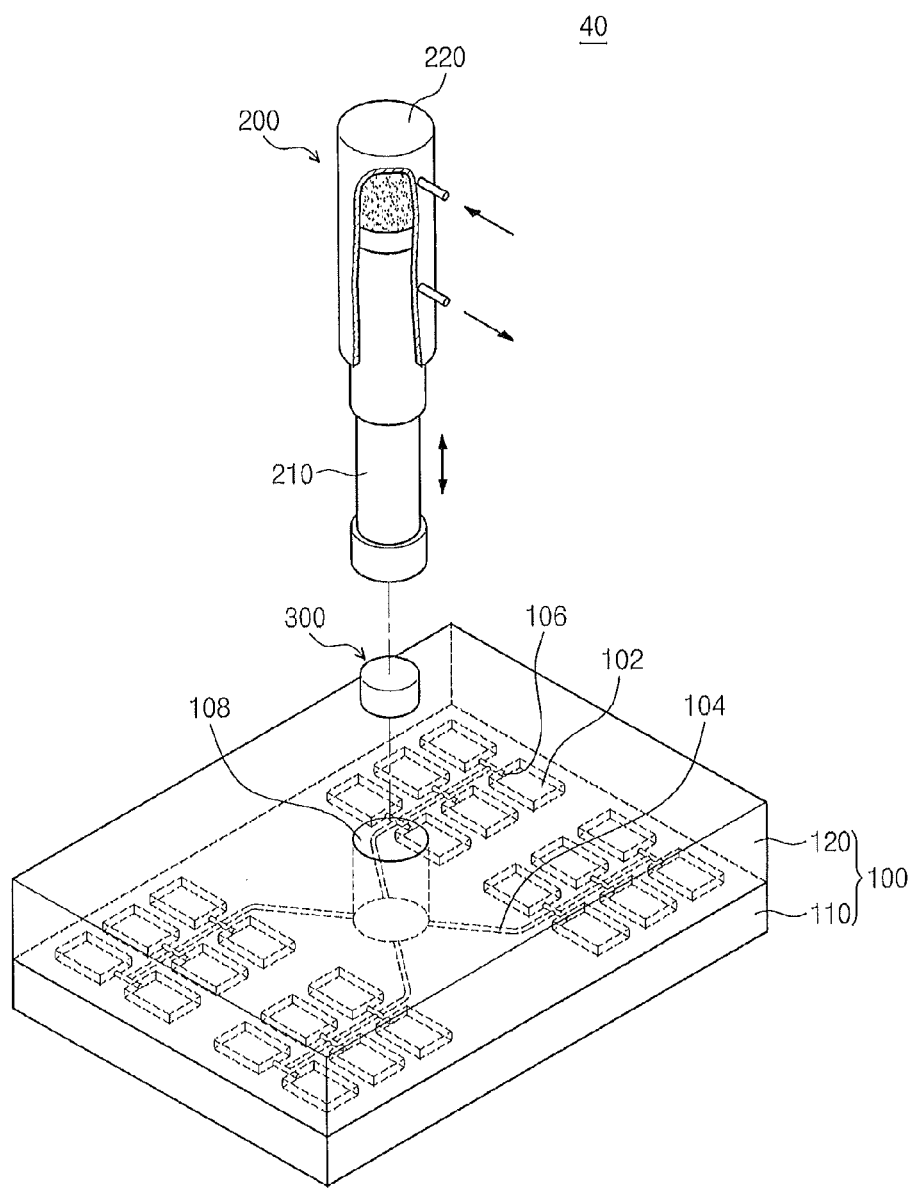
FIG. 2 is a perspective view illustrating a molding portion shown in FIG. 1.

FIG. 2 is a perspective view illustrating a molding portion shown in FIG. 1. Referring to FIG. 2, the molding portion 40 may include a mold 100 and a press member 200 which pressurizes molten molding material provided into the mold 100.

The mold 100 includes a lower mold 110 and an upper mold 120 that are coupled to or separated from each other to provide mold cavities 102. In the lower mold 110 and the upper mold 120, there are runners 104 as supply channels of molding material, and gates 106 as junction portions of the runners 104 and the mold cavities 102.

A port 108 is formed in the center of the upper mold 120 and connected to the runners 104. Molding material 300 is provided to the port 108. The molding material 300 may include an EMC (Epoxy Molding Compound). The molding material 300 may be solid state and then heated in the port 108 to be changed into molten state with a predetermined viscosity. Alternatively, the molding material may be provided to the port 108 in the molten state.

The press member 200 includes a plunger 210 and a pressing device 220 used to apply pressure to the plunger 210. The plunger 210 may have a rod shape, and one end of the plunger 210 may be carried in and out of the port 108. The pressing device 220 may include a cylinder, and may be connected with the other end of the plunger 210. The cylinder may be a hydraulic cylinder or a pneumatic cylinder.

The plunger 210 is shifted up and down by hydraulic pressure or pneumatic pressure to pressurize the molten molding material in the port 108. The molding material pressurized by the plunger 210 fills in the mold cavities 102 through the runners 104 connected with the port 108 and the gates 106 connected with the end of the runners 104. A circuit board with semiconductor chips is located in the mold cavity 102, and the chips are encapsulated with the molding material that fills in the mold cavity 102.

Figure 3:
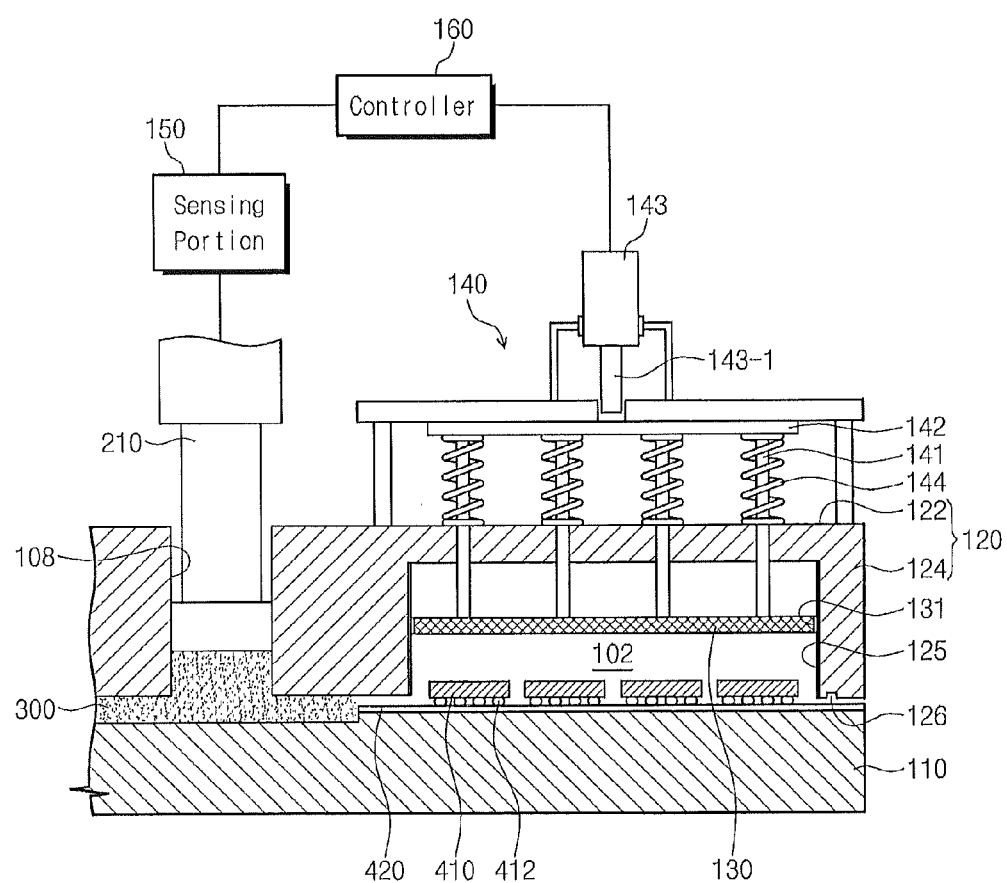
FIG. 3 is a cross sectional view illustrating an interior structure of the mold shown in FIG. 2.
Figure 4:
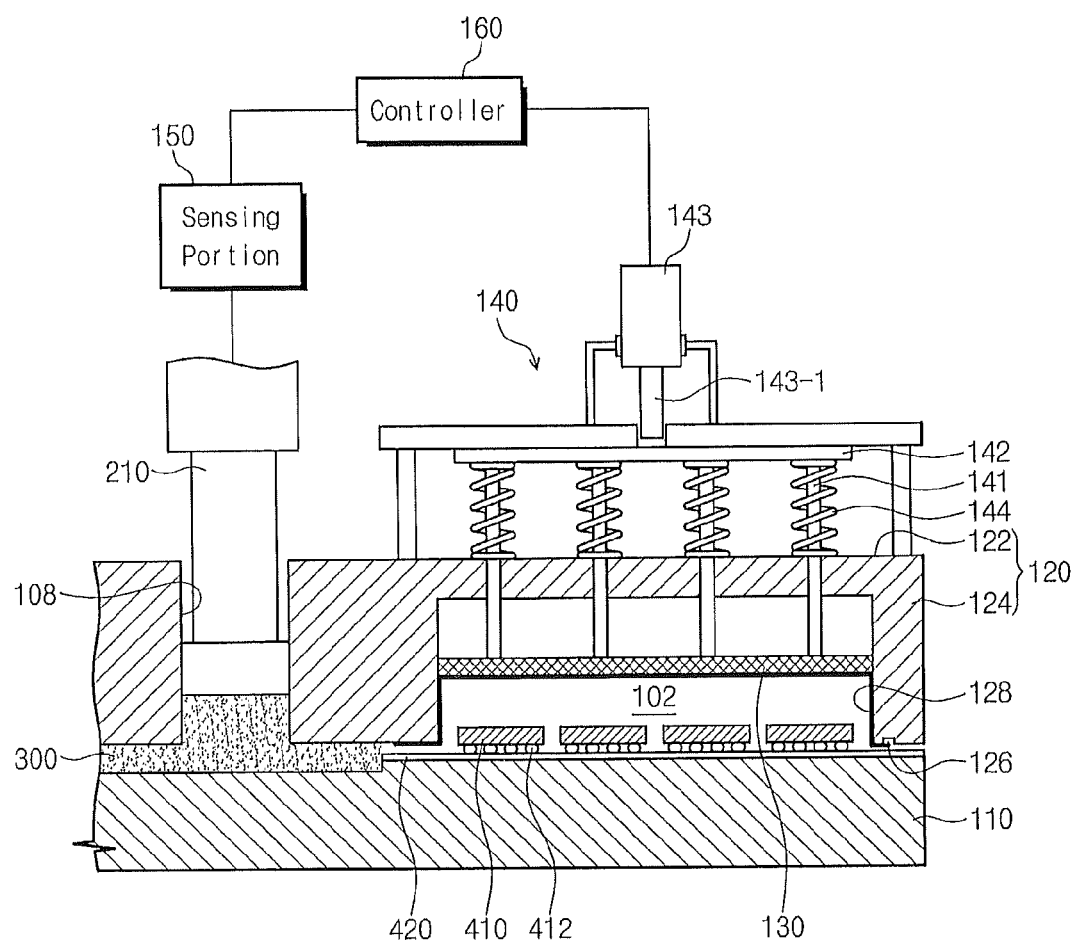
FIG. 4 is a cross sectional view illustrating another structure of the mold shown in FIG. 2.

FIG. 3 is a view illustrating an interior structure of the mold shown in FIG. 2, and FIG. 4 is a view illustrating another structure of the mold shown in FIG. 2. Referring to FIG. 3, the mold 100 includes the lower mold 110 and the upper mold 120. The upper mold 120 may be disposed on the lower mold 110. The lower mold 110 and the upper mold 120 may be coupled to or separated from each other in a vertical direction.

The lower mold 110 may be provided as flat plate shape. A circuit board 420 with semiconductor chips 410 mounted thereon may be disposed on the upper surface of the lower mold 110. The upper mold 120 has a lower-opened shape. The upper mold 120 may include an upper plate 122 and a side plate 124. The side plate 124 may extend downward from the periphery of the upper plate 122. The mold cavity 102 may be formed of an inner space surrounded by the upper plate 122 and the side plate 124, when the lower mold 110 and the upper mold 120 are coupled to each other. An air vent 126 may be formed on a bottom surface of side plate 124 of upper mold 120 adjacent contact with the lower mold 110. Air in the mold cavity may be exhausted through the air vent 126 during a process of filling the molding material in the mold cavity.

The circuit board 420 with semiconductor chips thereon is disposed on the lower mold 110. The semiconductor chips may include semiconductor memory devices. The semiconductor chips 410 have terminals 412, and the terminals 412 are respectively connected with bonding pads of the semiconductor chips 410. The terminals 412 may be flip chip solder bumps.

A molding plate 130 is disposed in the inner space of the upper mold 120, that is, the mold cavity 102. The molding plate 130 defines a space used to fill the molding material between the lower mold 110 and the upper mold 120. The molding plate may be shifted up and down by moving unit 140 to change the space to fill the molding material.

Coating layers 131 and 125 of ceramics may be formed on a sidewall of the molding plate 130 and an inner surface of the side plate 124 of the upper mold 120, respectively. The coating layers 131 and 125 may seal the molding plate 130 and the side plate 124 to reduce leakage of the molding material. Alternatively, a sealing film 128 may be used to seal the molding plate 130 and the side plate 124 as shown in FIG. 4. The sealing film 128 may be provided on the bottom surface of the molding plate 130 and the inner surface of the side plate 124.

A moving unit 140 that moves the molding plate 130 may include a moving rod 141, a support plate 142 and a driving member 143. A plurality of moving rods 141 may be installed vertically through the upper plate 122 of the upper mold 120. The bottom end of the moving rods 141 may be connected with the upper surface of the molding plate 130, and the top end of the moving rods 141 may be connected with the support plate 142. The support plate 142 may be disposed horizontally above the upper mold 120. The driving member 143 may be a cylinder disposed above the support plate 142. The cylinder may be provided such that the rod 143-1 is aligned in the vertical direction and the end of the rod 143-1 is separated from the support plate 142.

An elastic member 144 may be provided between the support plate 142 and the upper mold 120. The elastic member 144 applies elastic restoring force to push the support plate 142 upward. The elastic member 144 may be a plurality of coil springs, and each coil spring may surround a respective moving rod 141.

Initially, the rod 143-1 of the driving member 143 is located at the upper side, separated from the support plate 142. The support plate 142 and the moving rods 141 are elevated by the elastic member 144. Therefore, the molding plate 130 connected with the moving rods 141 is elevated. When the rod 143-1 of the driving member 143 moves to push the support plate 142 downward, the elastic members 144 are compressed and the moving rods 141 and the molding plate 130 descend. When the rod 143-1 of the driving member 143 moves up, the molding plate 130 is relocated at the initial position by the elastic restoring force of the elastic member 144. The height of the molding plate 130 may be adjusted by a protrusion length of the rod 143-1 of the driving member 143.

Like the above-mentioned procedure, the moving unit 140 may move the molding plate 130 up and down. Pressure of the molding material filling in the mold cavity 102 may be controlled by movement of the molding plate 130. That is, pressure of the molding material being provided on the semiconductor chips and pressure of the molding material being provided between the semiconductor chips and the circuit board may be controlled. As the molding plate 130 is descending, a distance between the molding plate 130 and the semiconductor chips 410 may be reduced so that a pressure of the molding material on the semiconductor chips 410 is increased. As the mold plate elevates, a distance between the molding plate 130 and the semiconductor chips 410 increase so that a pressure of the molding material on the semiconductor chips 410 is reduced.

A height of the molding plate 130 may be adjustable according to pressure of plunger 210. When a pressure of the plunger 210 is raised, a sensing portion 150 may sense the pressure increase of the plunger 210. A sensed signal from the sensing portion 150 is transmitted to a controller 160. Then, the controller 160 generates a control signal corresponding to the sensed signal to control the driving member 143 so that the molding plate 130 is elevated. In contrast, when the pressure of the plunger 210 goes down, a sensing portion 150 may sense the reduced pressure of the plunger 201. If the sensed signal from the sensing portion 150 is transmitted to a controller 160, the controller 160 generates a control signal corresponding to the sensed signal to control the driving member 143 so that the molding plate 130 is driven down.

The height of the molding plate 130 may be adjustable according to an amount of molding material that is supplied by the plunger 210. The supply amount of the molding material may be measured by measuring a distance of movement of the plunger 210. If a supplied amount of the molding material is increased by the plunger 210, that is, if the displacement of the plunger 210 is increased, the sensing portion 150 senses the displacement of the plunger 210 and transmits the sensed signal to the controller 160. Then, the controller 160 generates a control signal corresponding to the sensed signal to control the driving member so that the molding plate is elevated. If a supplied amount of the molding material is decreased by the plunger 210, that is, if the displacement of the plunger 220 decreases, the sensing portion 150 senses the displacement of the plunger 210 and transmits the sensed signal to the controller 160. Then, the controller 160 generates a control signal corresponding to the sensed signal to control the driving member so that the molding plate descends.

The molding material may be provided additionally into the mold cavity 102, or a portion of the molding material may be drawn back from the mold cavity 102. The molding material may be further provided into the mold cavity 102 by elevating the molding plate 130 after initially providing the molding material into the mold cavity 102. In contrast, a portion of molding material may be drawn back from the molding cavity 102 by moving the molding plate 130 down after initially providing the molding material into the mold cavity 120.

Figure 5A:
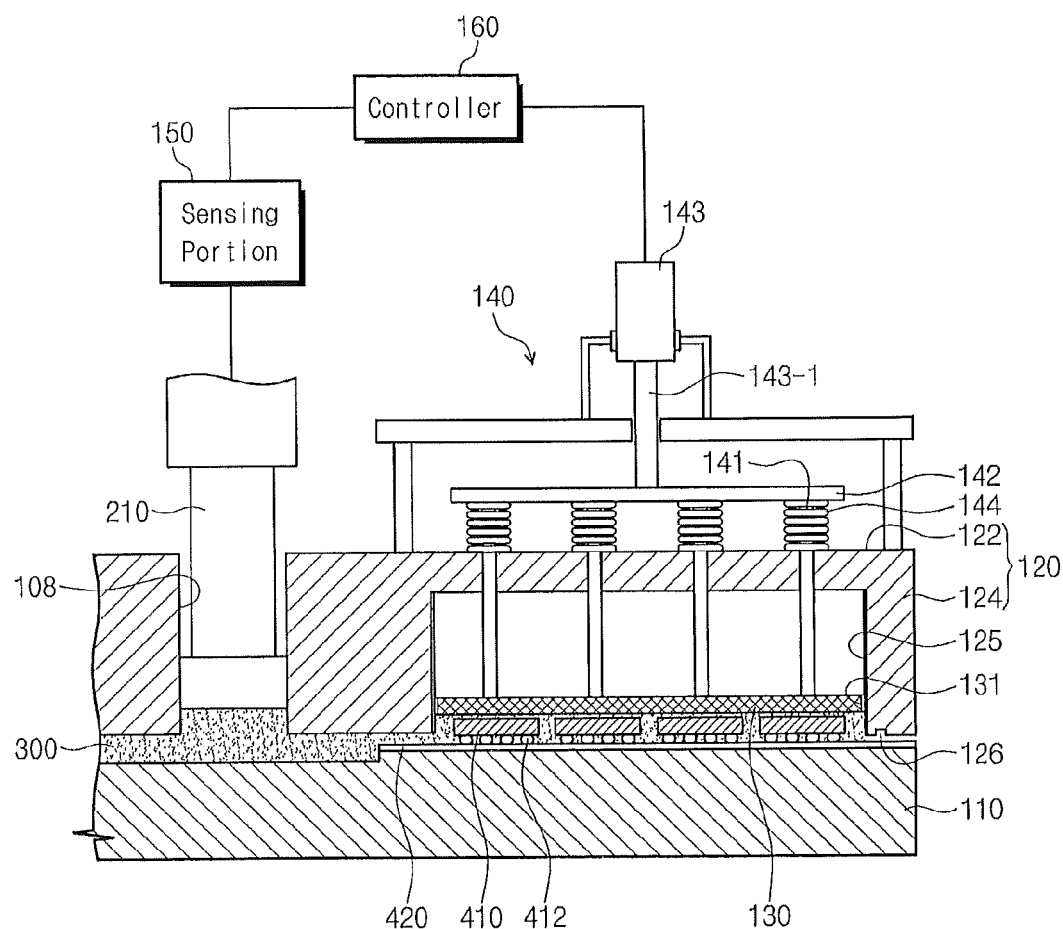
FIGS. 5A through 5C are cross sectional views illustrating a method of fabricating semiconductor packages according to embodiments of the present invention.
Figure 5B:
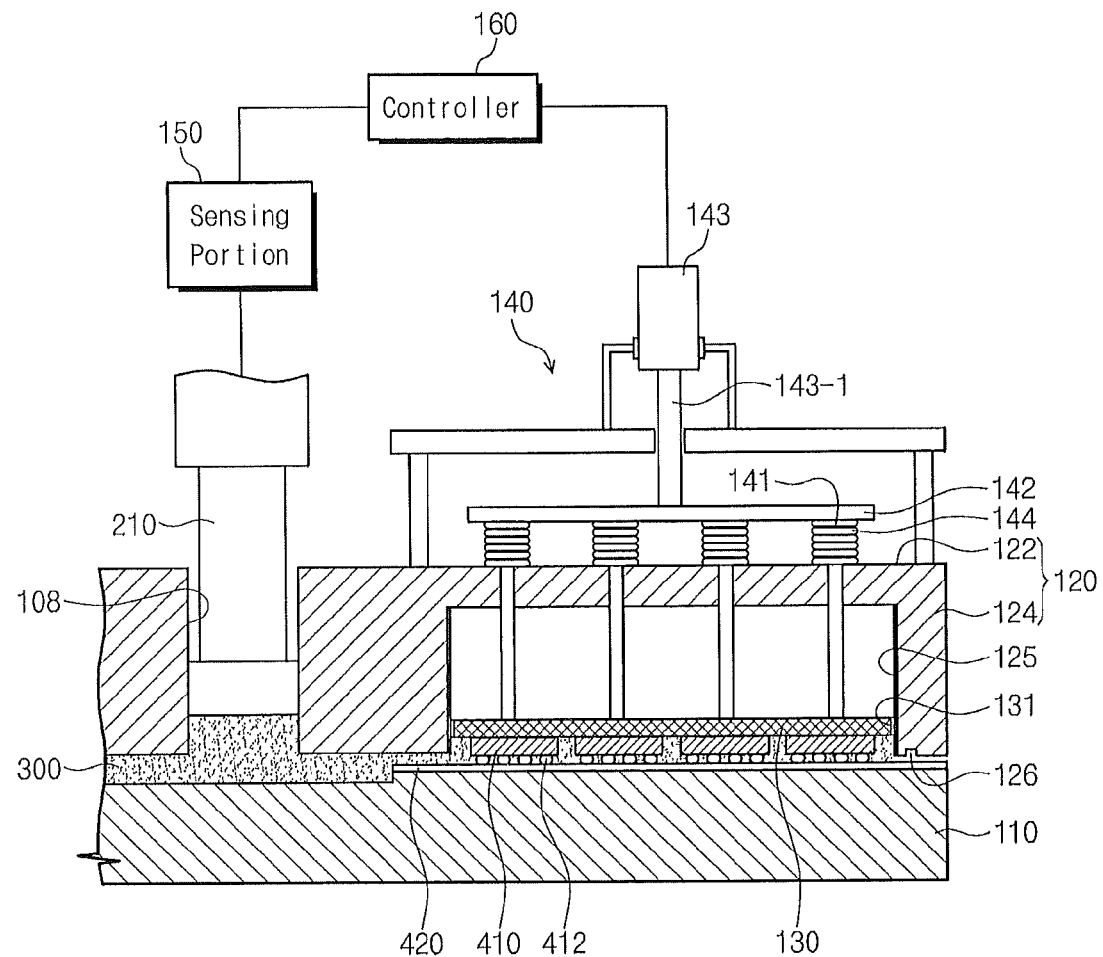
Figure 5C:
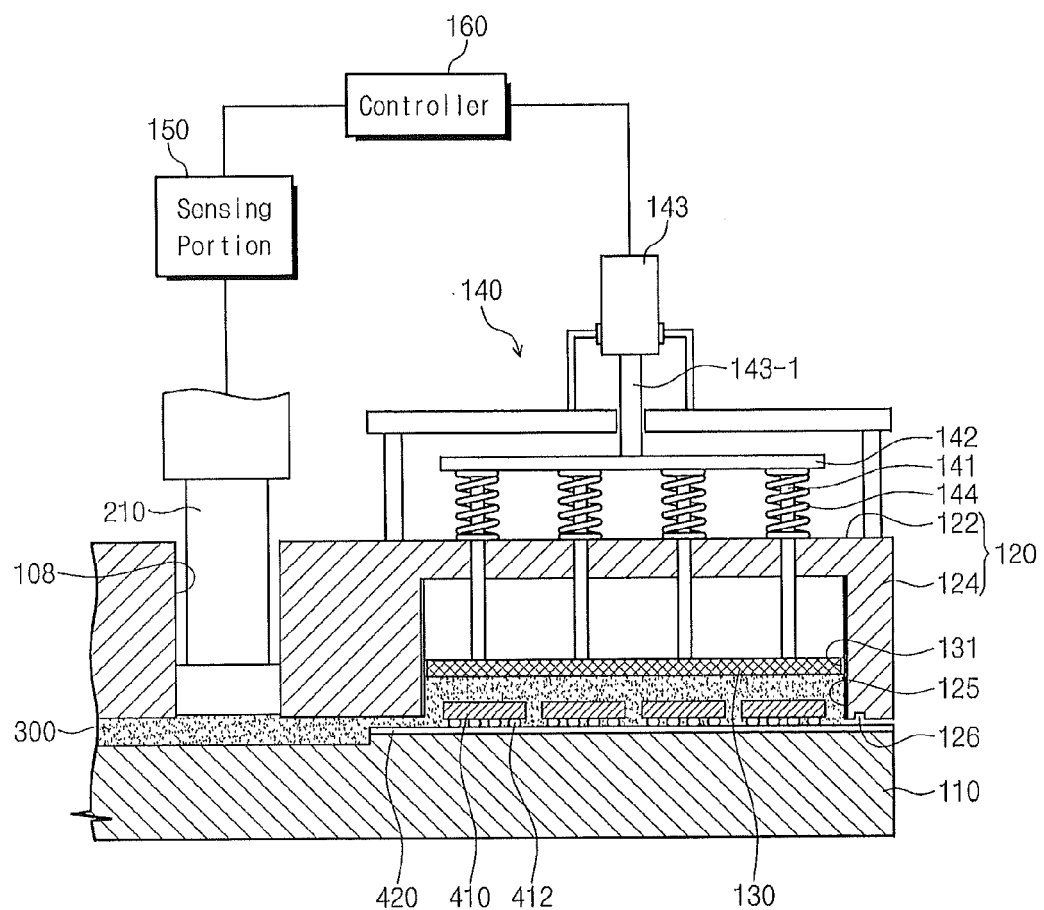

FIGS. 5a through 5c are views illustrating methods of fabricating semiconductor packages according to embodiments of the present invention.

Referring to FIG. 5a, a circuit board 420 is prepared. Semiconductor chips 410 including terminals 412 are mounted on the circuit board 420. At least some of the semiconductor chips 410 may be semiconductor memory devices. The semiconductor chips 410 include bonding pads. The terminals 412 are connected to the bonding pads. The terminals 412 electrically connect the semiconductor chips 410 and the circuit board 420. The semiconductor chips 410 may be flip chip mounted on the circuit board 420.

The circuit board 420 with semiconductor chips 410 is disposed between the lower mold 110 and the upper mold 120. The molding plate 130 is configured to move down to provide molding material between the semiconductor chips 410 and the circuit board 420. The molding plate 130 descends to a predetermined distance from the semiconductor chips 410. If the molding plate 130 does not move down, a void may be formed in the molding material because terminals 412 are located between the semiconductor chips 410 and the circuit board 420. The void may generate thermally induced stress to form a crack(s) in the package thereby reducing reliability of the semiconductor package.

More particularly, if the molding plate 130 does not move down, a first fluid pressure of the molding material between the semiconductor chips 410 and the molding plate 130 may not be equivalent to a second fluid pressure of the molding material between the semiconductor chips 410 and the circuit board 420. In this case, a large portion of the molding material may flow into the space between the semiconductor chips 410 and the molding plate 130 without filling the molding material in spaces between the semiconductor chips 410 and the circuit board 420, because the first fluid pressure of the molding material is lower than the second fluid pressure of the molding material. Fluid pressure means pressure that is applied to a surface perpendicular to a flow direction of the molding material.

According to some embodiments of the present invention, the molding plate 130 moves down so that the first fluid pressure between the molding plate 130 and the semiconductor chips 410 may be equivalent to the second fluid pressure between the semiconductor chips 410 and the circuit board 420. Accordingly, the molding material may sufficiently fill in the space between the terminals 412 that are located between the semiconductor chips 410 and the circuit board 420.

Referring to FIG. 5B, unlike FIG. 5A, providing the molding material between the semiconductor chips 410 and the circuit board 420 may be performed while the molding plate 130 is in contact with the semiconductor chips 410. The molding plate 130 may move down to contact the semiconductor chips 410. Then, the molding material flows between the semiconductor chips 410 and the circuit board 420 to fill in space between the terminals 412, thereby reducing void formation between the terminals 412.

Referring to FIG. 5c, the molding plate 130 may move up to provide additional molding material. The molding plate 130 may be located at a predetermined position in consideration of molding layer's thickness on the semiconductor chips 410. The height of the molding plate 130 may be adjustable according to pressure of the plunger 210. That is, the height of the molding plate 130 may be controlled responsive to sensing the pressure of the plunger 210. Alternatively, the height of the molding plate 130 may be adjustable according to an amount of the molding material. The semiconductor chips 410 are separated into semiconductor packages after hardening the molding material.

Generally, in flip-chip packaging, a molding process is performed to mold the flip-chip and the circuit board, after a flip-chip is mounted on a circuit board and an under-fill process is performed to isolate solder bumps electrically. Material of the under-fill process may be different from material of the molding process. The under-fill process may be performed using epoxy resin.

In contrast, the apparatus used to fabricate a semiconductor package according to embodiments of the present invention can simultaneously perform the under-fill process and the molding process using an identical material, and void formation between the terminals 412 of the semiconductor chips 410 may be reduced by providing molding material with the molding plate 130 moved down.

Figure 6A:
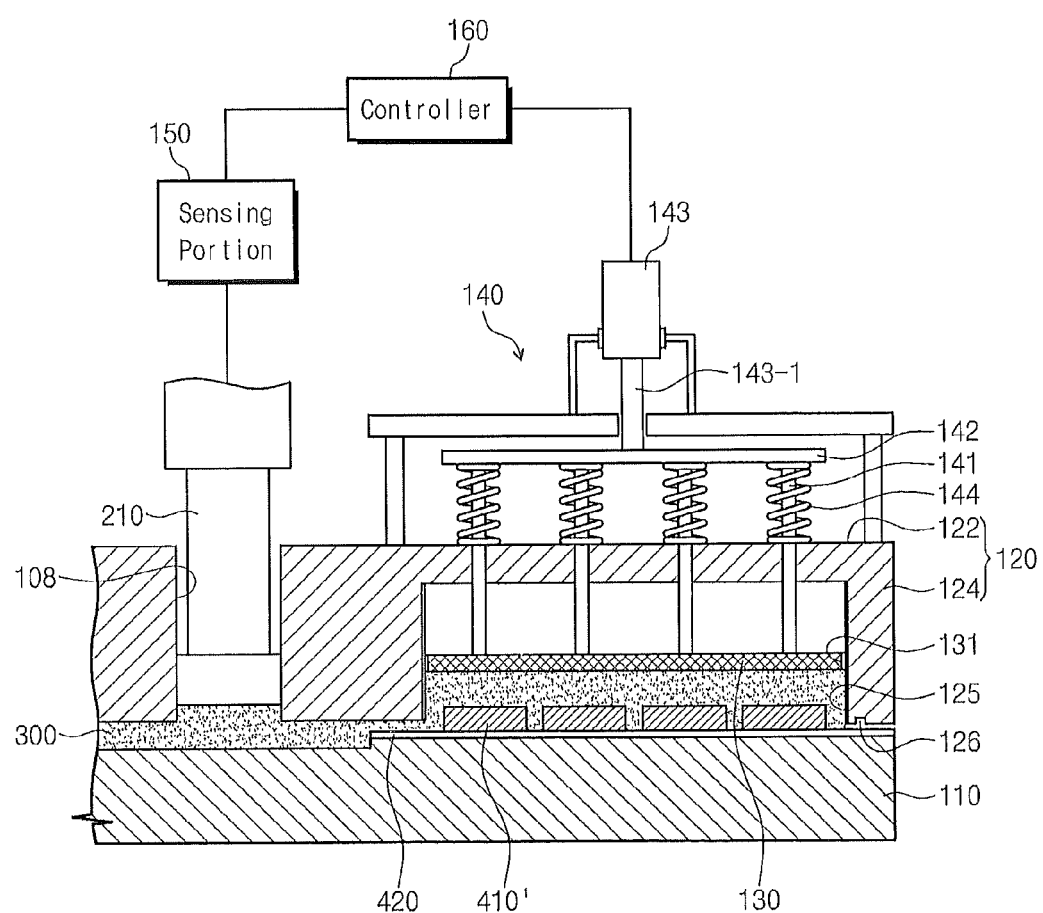
FIGS. 6A and 6B are cross sectional views illustrating a method of fabricating semiconductor packages according to other embodiments of the present invention.
Figure 6B:
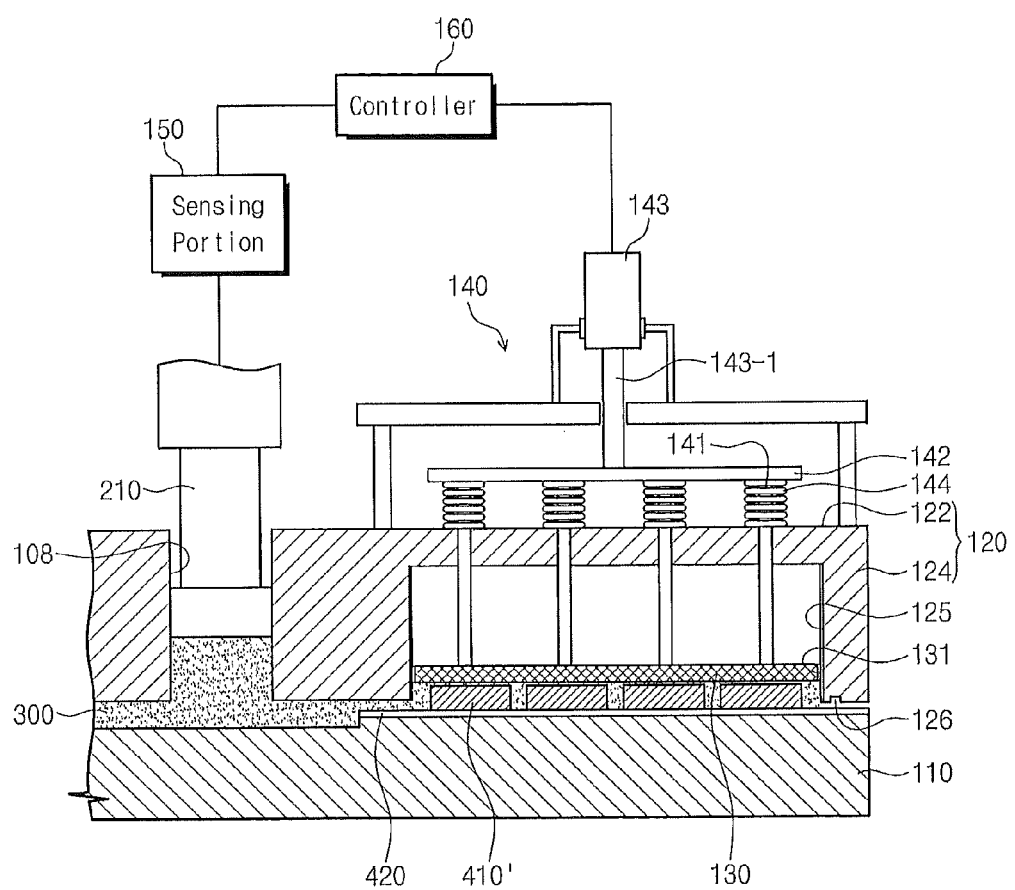

FIGS. 6a and 6b are cross sectional views illustrating a method of fabricating semiconductor packages according to other embodiments of the present invention.

Referring to FIG. 6a, a circuit board 420 with semiconductor chips 410' thereon is prepared. The semiconductor chips 410' may include semiconductor memory devices. The circuit board 420 with semiconductor chips 410' is disposed between a lower mold 110 and an upper mold 120.

Molding material is provided to the mold cavity 102 with molding plate 130 moved up. If the molding material is provided without molding plate 130 moved up, flow speed of the molding material may be unbalanced resulting in increased likelihood of void formation. That is, flow speed of the molding material flowing between semiconductor chips 410' may be higher than that of the molding material flowing on the semiconductor chips 410. In an alternative, the flow speed in the center of the circuit board 420 may be relatively slow if the semiconductor chips 410' are disposed close together. A void may generate thermal induced stress forming a crack on the semiconductor package, thereby reducing reliability of the semiconductor package.

If the molding plate 130 is moved up to secure a distance between the semiconductor chips 410' and the molding plate 130, a flow speed of the molding material may be balanced. Thus, embodiments of the present invention may reduce void formation in the molding layer on the semiconductor chips 410'.

Referring to FIG. 6b, a portion of the molding material may be drawn back by moving the molding plate 130 down. The molding plate 130 moves down to reduce a thickness of a molding layer that is to be formed on the semiconductor chips 410'. Height of the molding plate 130 may be adjustable according to pressure of plunger 210. The pressure of the plunger 210 may be sensed and the molding plate 130 may move down responsive to sensed pressure of the plunger 120. Alternatively, the molding plate 130 may move down by drawing back molding material that is provided by the plunger 210. After the molding material is provided, the molding material may harden and the semiconductor chips 410' may be separated into semiconductor packages.

Figure 7A:
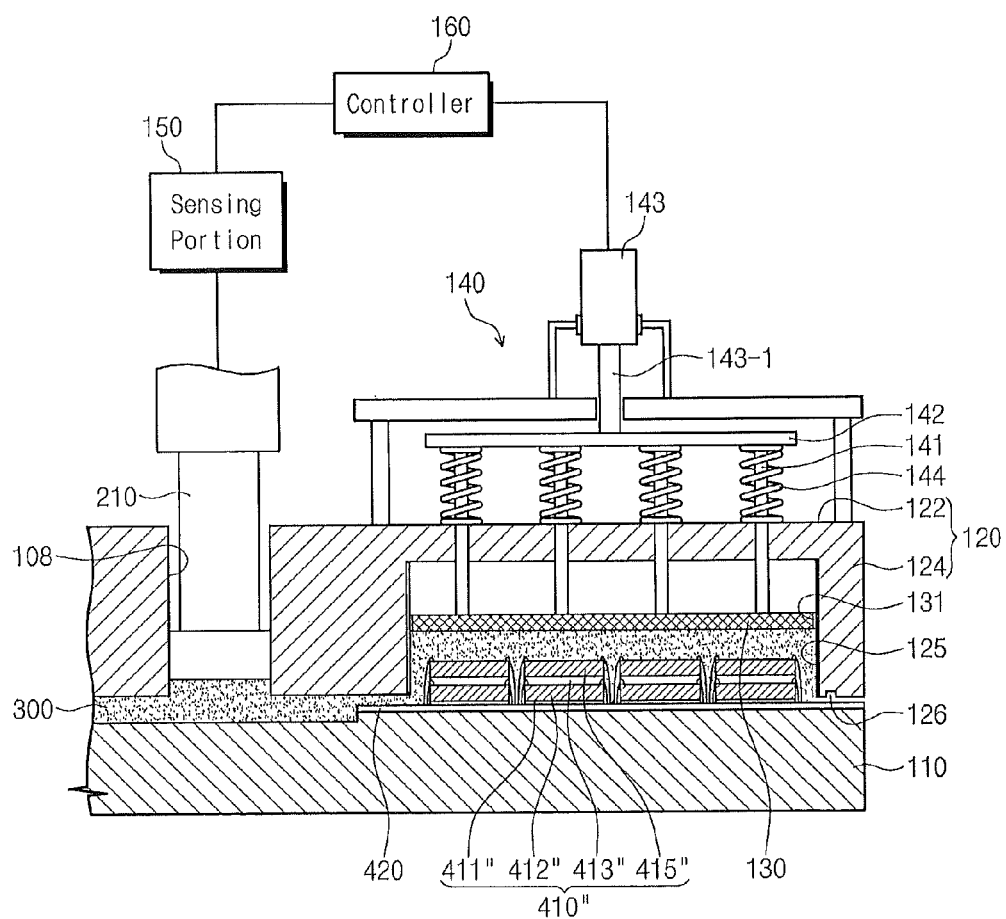
FIGS. 7A and 7B are cross sectional views illustrating a method of fabricating semiconductor packages according to other embodiments of the present invention.
Figure 7B:
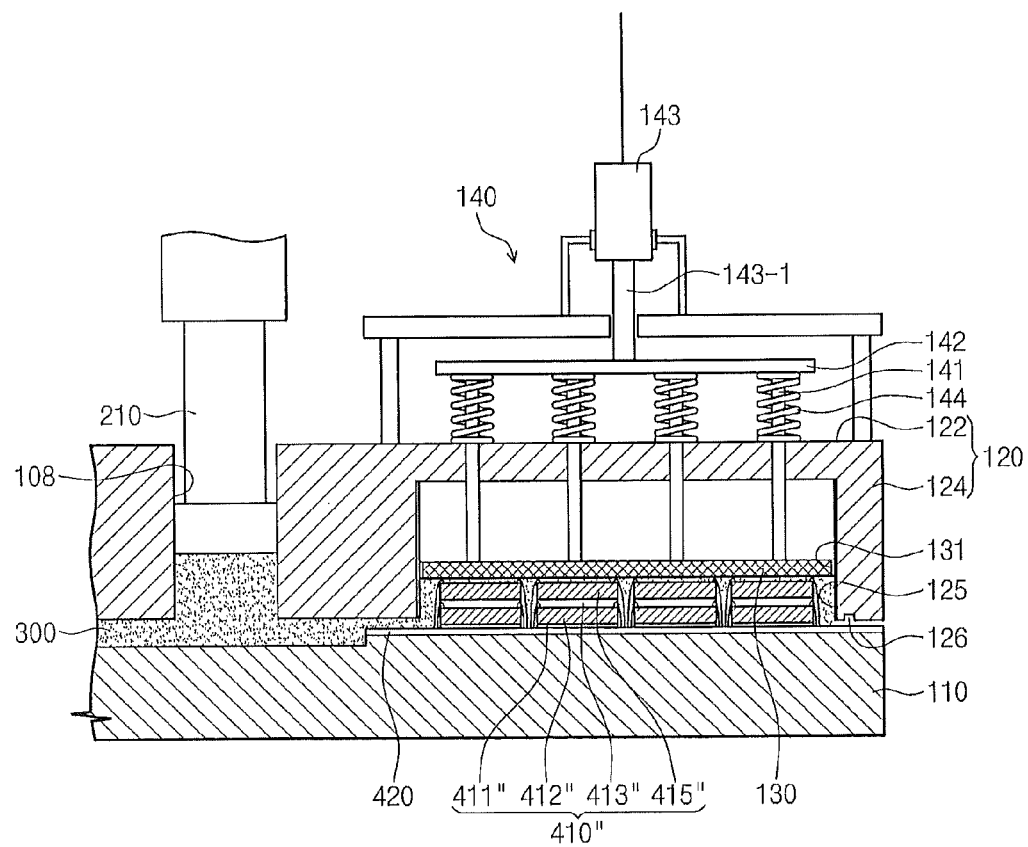

FIGS. 7a and 7b are views illustrating a method of fabricating semiconductor packages according to other embodiments of the present invention.

Referring to FIG. 7a, a circuit board 420 with semiconductor chips 410" is prepared. The semiconductor chips 410" may include semiconductor memory devices. The semiconductor chips 410" may include a plurality of chips that are stacked. The semiconductor chips 410" may be a multi-chip package. The semiconductor chips 410" may include an adhesive layer 411" on the circuit board 420, a first semiconductor chip 412" on the adhesive layer 411", an insulating layer 413" on the first semiconductor chip 412", a second semiconductor chip 415" on the insulating layer 413", and a wire or wires electrically connecting the first and the second semiconductor chips 412" and 415" to the circuit board 420.

The circuit board 420 embedded with semiconductor chips 410" is disposed between a lower mold 110 and an upper mold 120. Molding material 300 is provided with molding plate 130 moved up. If the molding material 300 is provided on the semiconductor chip 410" without the molding plate 130 moved up, flow speed of the molding material may be unbalanced and/or void formation may occur. That is, flow speed of the molding material flowing between semiconductor chips 410" may be higher than that of the molding material flowing on the semiconductor chips 410", and/or flow speed in the center of the circuit board 420 may be reduced because the semiconductor chips 410" are disposed close together. A void may generate thermal induced stress to form a crack on the semiconductor package, thereby reducing reliability of the semiconductor package.

If the molding plate 130 has moved up to secure a distance between the semiconductor chips 410" and the molding plate 130, flow speed of the molding material may be balanced. Thus, void formation in the molding layer on the semiconductor chips 410" may be reduced.

Referring to FIG. 7b, a portion of the molding material may be drawn back by moving the molding plate 130 down. The molding plate 130 moves down to reduce a thickness of a molding layer that is to be formed on the semiconductor chips 410". Since a multi-chip package has a plurality of chips that are stacked up, a thickness of the mold layer may be reduced to reduce a total thickness of a multi-chip package. Height of the molding plate 130 may be adjustable according to pressure of plunger 210. The pressure of the plunger 210 may be sensed and the molding plate 130 may move down responsive to sensed pressure of the plunger 210. Alternatively, the molding plate 130 may move down by drawing back molding material that is provided by the plunger 210. After the molding material is provided, the molding material may be hardened and the semiconductor chips 410" may be separated into semiconductor packages.

Figure 8:
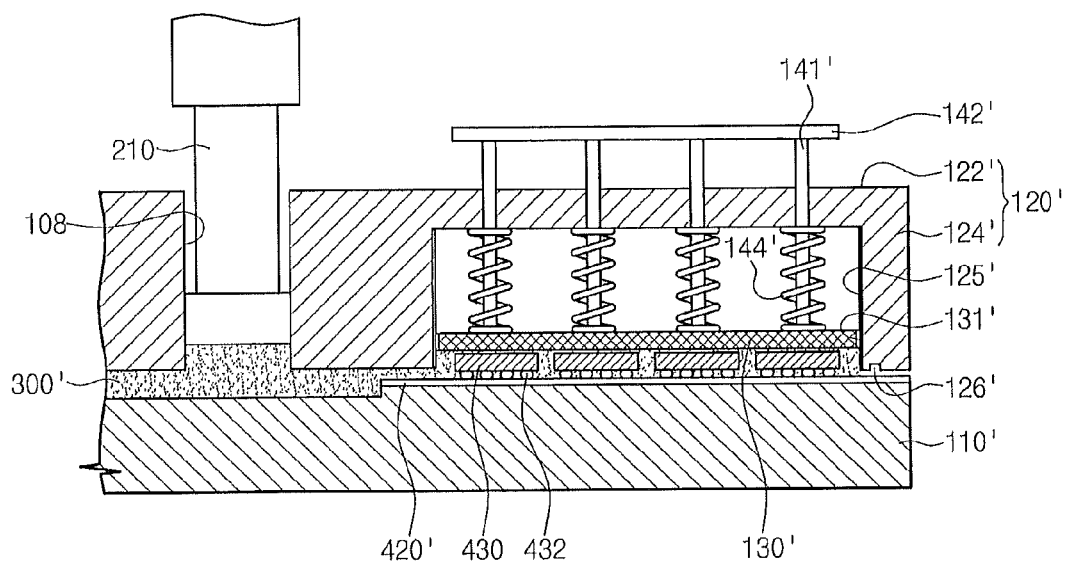
FIG. 8 is a cross sectional view illustrating other structures of the mold shown in FIG. 2.
Figure 9:
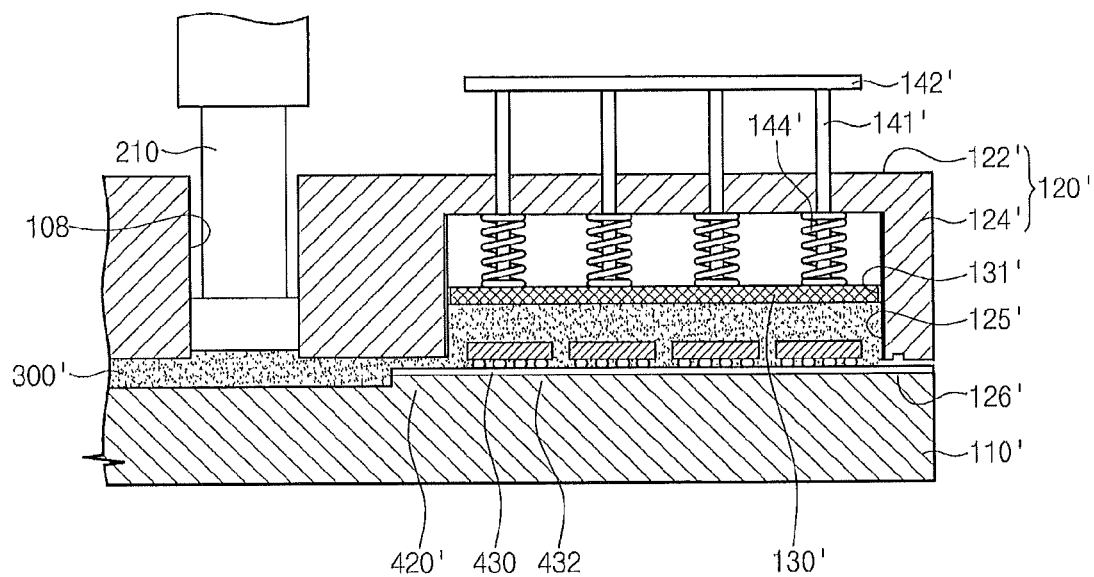
FIG. 9 is a cross sectional view illustrating an operation of the mold shown in FIG. 8.

FIG. 8 is a cross sectional view illustrating other structures of the mold shown in FIG. 2, and FIG. 9 is a cross sectional view illustrating operation of the mold shown in FIG. 8.

Referring to FIG. 8 and FIG. 9, the mold includes a lower mold 110' and an upper mold 120'. The upper mold 120' is disposed on the lower mold 110'. The lower mold 110' and the upper mold 120' may be coupled to or separated from each other in a vertical direction.

The lower mold 110' may be provided as a shape of a substantially flat plate. A circuit board 420' with semiconductor chips 430 is disposed on an upper surface of the lower mold 110'. The upper mold 120' has a lower-opened shape. The upper mold 120' includes an upper plate 122' and a side plate 124'. The side plate 124' extends downward from the periphery of the upper plate 122'. The mold cavity may be formed of an inner space surrounded by the upper plate 122' and the side plate 124' when the lower mold 110' and the upper mold 120' are coupled to each other. An air vent 126' is formed at a bottom portion of the side plate 124' of the upper mold 120' where the lower mold 110' is in contact. Air in the mold cavity may be exhausted through the air vent 126 during a process of filling mold material into the mold cavity.

The circuit board 420' with semiconductor chips is disposed on the lower mold 110'. The semiconductor chips 430 may be semiconductor memory devices. The semiconductor chips 430 may include terminals 432. The terminals 432 may be respectively connected with bonding pads of the semiconductor chips 430. The terminal 432 may be a flip chip solder bump.

A molding plate 130' is disposed in the inner space of the upper mold 420', that is, the mold cavity. The molding plate 130' defines a space to fill the molding material between the lower mold 110' and the upper mold 120'. The molding plate may be shifted up and down to change the space where the molding material is provided.

Coating layers 131' and 125' of ceramics may be formed on the sidewall of the molding plate 130' and an inner surface of the side plates 124' of the upper mold 120', respectively. The coating layer 131' and 125' seals the molding plate 130' and the side plate 124' to reduce leakage of the molding material between the molding plate 130' and the side plate 124'.

A plurality of moving rods 141' may be provided. The moving rods 141' may be installed vertically through the upper plate 122' of the upper mold 120'. A bottom end of moving rod 141' may be connected with an upper surface of the molding plate 130' and a top end of moving rod 141' may be connected with the support plate 142'. The support plate 142' is disposed horizontally above the upper mold 120'. Elastic members 144' may be provided between the molding plate 130' and the upper plate 122' of the upper mold 120'. Each elastic member 144' may apply elastic restoring force to push the molding plate 130' downward. The elastic member 144' may include a coil spring surrounding the moving rod 141'.

In an initial state, the molding plate 130' moves down to a height determined by the elastic member 144'. The height may be a height capable of maintaining a balanced flow of molding material that is provided to space under the molding plate 130' and reducing void formation. The molding material fills the space under the molding plate 130' by pressure of the plunger 210. The molding material may be provided continuously by increasing pressure of the plunger 210. The molding plate 130' then moves up in accordance with pressure of the molding material. The height of the molding plate 130' may be controlled by adjusting the pressure of the plunger 210'. After hardening the molding material, the semiconductor chips are separated into semiconductor packages.

Figure 10:
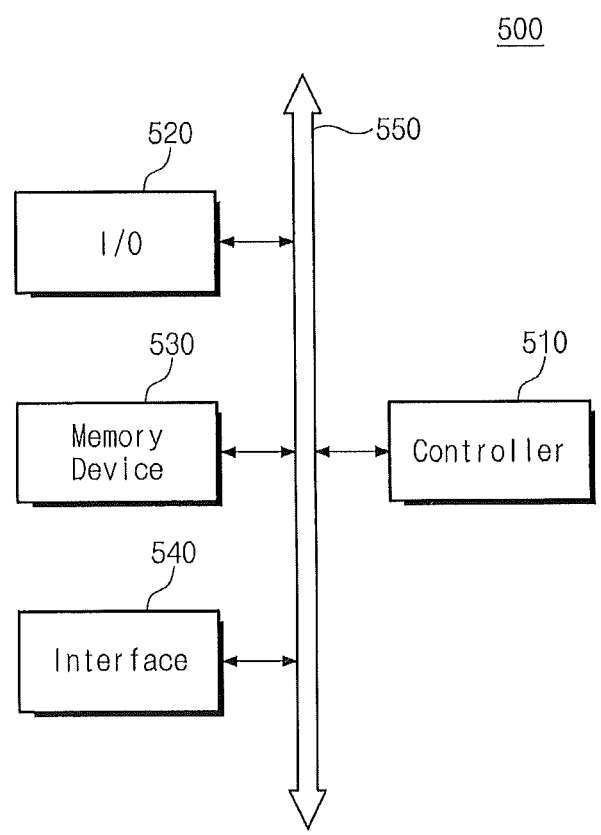
FIG. 10 is a block diagram illustrating an electrical system embedded with a semiconductor package according to embodiments of the present invention.

FIG. 10 is a block diagram illustrating an electronic system that may be provided with a semiconductor package according to embodiments of the present invention.

Referring to FIG. 10, an electronic system 500 according to embodiments of the present invention may include a controller 510, an I/O (input and output) device 520, a memory device 530, an interface 540, and a bus 550. The controller 510, the I/O device 520, the memory device 530 and/or the interface 540 may be electrically connected with each other by the bus 550. The bus 550 is a path through which data may be transmitted/received.

The controller 510 may include at least one of a microprocessor, a digital signal processor, a micro-controller, and/or a logic device capable of performing similar functions. The I/O device 520 may include a keypad, a keyboard and/or a display device. The memory device 530 may store data and/or instruction codes. The memory device 530 may include semiconductor memory devices that are fabricated using an apparatus and/or method for fabricating semiconductor packages discussed above. The interface 540 may transmit data to a communication network and/or receive data from a communication network. The interface 540 may include a wire type and/or a wireless type, for example an antenna or a wire/wireless transceiver. The electronic system 500 may further include a high speed DRAM and/or SRAM as a driving memory to enhance performance of the controller 510.

The electronic system 500 may include a personal digital assistant (PDA), a portable computer, a web tablet, a wireless phone, a mobile phone, a digital music player, a memory card, or other electronic appliances/devices capable of transmitting and/or receiving data in wired and/or wireless environment.

Figure 11:
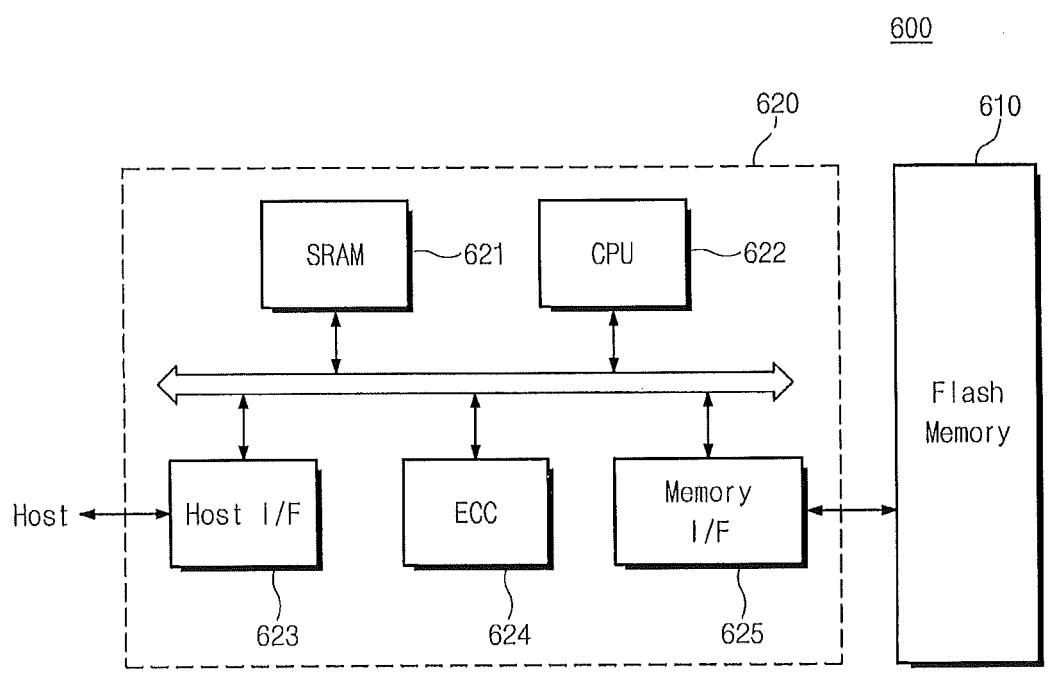
FIG. 11 is a block diagram illustrating a memory card including a semiconductor package according to embodiments of the present invention.

FIG. 11 is a block diagram illustrating a memory card with a semiconductor package according to embodiments of the present invention.

Referring to FIG. 11, a memory card 600 according to embodiments of the present invention may include a memory device 610. The memory device 610 may include a semiconductor memory device fabricated using an apparatus and/or a method discussed above. The memory card 600 may include a memory controller 620 that controls data exchange between a host and the memory device 610.

The memory controller 620 may include a processing unit 622 controlling overall operations of the memory card. The memory controller 620 may also include a SRAM 612 as a driving memory of the processing unit 622. The memory controller 620 may further include a host interface 623 and a memory interface 625. The host interface 623 may provide a data exchange protocol between the memory card 600 and the host. The memory interface 625 may connect the memory controller 620 and the memory device 610. The memory controller 620 may further include an ECC (Error Correcting Block) 624. The ECC 624 may detect and correct an error in data that is read from the memory device 610. The memory card 600 may further include a ROM device (not shown) in which code data to interface with the host is stored. The memory card 600 may be used as a portable data storage card. Alternatively, the memory card 600 may be used as a SSD (Solid State Disk) that is capable of replacing hard disks of computer systems.

According to some embodiments of the present invention, an apparatus used to fabricate a semiconductor package may have a movable molding plate in a mold cavity. The molding plate may move to change space in which molding material is provided to thereby maintain a balanced flow of the molding material. Therefore void formation may be reduced so that reliability of the semiconductor package can be improved. By reducing voids, formation of cracks in the semiconductor package may be reduced.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for fabricating a semiconductor device, the method comprising:

providing a molding plate and a circuit board with a semiconductor chip mounted thereon in a mold cavity of a mold, wherein the molding plate is provided such that the semiconductor chip is disposed between the molding plate and the circuit board; and providing a molding material into the mold cavity with the circuit board therein, wherein the molding plate is configured to move in the mold cavity relative to the circuit board to adjust a volume of a space in the mold cavity into which the molding material is introduced, wherein the molding plate and the circuit board define the space therebetween and the molding material directly contacts the molding plate, wherein the mold comprises first and second mold portions configured to be coupled and/or separated in a direction perpendicular with respect to a surface of the circuit board, wherein the mold cavity is defined between the first and second mold portions, wherein providing the molding material comprises providing the molding material into the space defined between the circuit board and the molding plate, wherein the semiconductor chip includes contact terminals providing electrical coupling with the circuit board, and wherein providing the molding material comprises, moving the molding plate toward the circuit board to provide the molding material between the semiconductor chip and the circuit board, and moving the molding plate away from the circuit board to allow additional molding material into the molding cavity after moving the molding plate toward the circuit board.

2. The method according to claim 1 wherein moving the molding plate toward the circuit board comprises moving the molding plate into contact with the semiconductor chip.

3. The method according to claim 1 wherein moving the molding plate toward the circuit board comprises moving the molding plate toward the circuit board without contacting the semiconductor chip while providing the molding material between the semiconductor chip and the circuit board.

4. The method according to claim 1 wherein the semiconductor chip is flip chip mounted on the circuit board and wherein the molding material between the semiconductor chip and the circuit board is the same as the molding material between the semiconductor chip and the molding plate.

5. A method for fabricating a semiconductor device, the method comprising:
- providing a molding plate and a circuit board with a semiconductor chip mounted thereon in a mold cavity of a mold, wherein the molding plate is provided such that the semiconductor chip is disposed between the molding plate and the circuit board; and
- providing a molding material into the mold cavity with the circuit board therein, wherein the molding plate is configured to move in the mold cavity relative to the circuit board to adjust a volume of a space in the mold cavity into which the molding material is introduced, wherein the molding plate and the circuit board define the space therebetween and the molding material directly contacts the molding plate, wherein the mold comprises first and second mold portions configured to be coupled and/or separated in a direction perpendicular with respect to a surface of the circuit board, wherein the mold cavity is defined between the first and second mold portions, wherein providing the molding material comprises providing the molding material into the space defined between the circuit board and the molding plate, and wherein providing the molding material comprises,
  - moving the molding plate away from the circuit board to provide the molding material on the semiconductor chip, and
  - moving the molding plate toward the circuit board to reduce a thickness of the molding material on the semiconductor chip after moving the molding plate away from the circuit board.

6. The method according to claim 5 wherein the semiconductor chip includes a plurality of stacked semiconductor chips.

7. The method according to claim 1, wherein the molding plate extends parallel to the circuit board such that the molding material introduced into the space contacts a sidewall of the mold.

8. The method according to claim 1, wherein moving the molding plate toward the circuit board or moving the molding plate away from the circuit board comprises moving the molding plate using a moving unit that is coupled to the molding plate, wherein the moving unit is configured to be controlled by a control unit according to a parameter of a press member that is configured to apply pressure to the molding material introduced into the space.

9. The method according to claim 8, wherein the parameter of the press member is a pressure exerted to the press member or distance that the press member moves.

10. The method according to claim 3, wherein moving the molding plate toward the circuit board comprises providing the molding material concurrently into a first gap between the molding plate and an upper surface of the semiconductor chip and a second gap between a lower surface of the semiconductor chip and the circuit board.

11. A method for fabricating a semiconductor device, the method comprising:
- providing a circuit board with a semiconductor chip mounted thereon in a mold cavity of a mold;
- locating a molding plate that is disposed in the mold cavity at a first distance relative to the circuit board, wherein the semiconductor chip is disposed between the molding plate and the circuit board, and the molding plate is configured to move toward and away from the circuit board;
- introducing a molding material into a space defined between the molding plate and the circuit board after locating the molding plate at the first distance such that the molding material directly contacts the molding plate; and
- moving the molding plate from the first distance to a second distance relative to the circuit board after introducing the molding material into the space, wherein the second distance is different from the first distance.

12. The method of claim 11, wherein the first distance is less than the second distance.

13. The method of claim 12, wherein locating the molding plate at the first distance comprises locating the molding plate spaced apart from the semiconductor chip such that introducing the molding material into the space comprises introducing the molding material concurrently into a first gap between the molding plate and an upper surface of the semiconductor chip and a second gap between a lower surface of the semiconductor chip and the circuit board.

14. The method of claim 11, wherein moving the molding plate from the first distance to the second distance comprises moving the molding plate using a moving unit that is coupled to the molding plate, wherein the moving unit is configured to be controlled by a control unit according to a parameter of a press member that is configured to apply pressure to the molding material introduced into the space.

15. The method of claim 14, wherein the parameter of the press member is a pressure exerted to the press member or distance that the press member moves.

16. The method of claim 11, wherein the first distance is greater than the second distance.

17. The method of claim 16, wherein locating the molding plate at the first distance comprises locating the molding plate spaced apart from the semiconductor chip such that introducing the molding material into the space comprises introducing the molding material directly contacting an upper surface and a sidewall of the semiconductor chip.

18. The method of claim 16, wherein moving the molding plate from the first distance to the second distance comprises removing a portion of the molding material from the space.

19. The method according to claim 5, wherein the molding plate extends parallel to the circuit board such that the molding material introduced into the space contacts a sidewall of the mold.

* * * * *